US010510582B2

United States Patent
Odnoblyudov et al.

(10) Patent No.: US 10,510,582 B2
(45) Date of Patent: *Dec. 17, 2019

(54) ENGINEERED SUBSTRATE STRUCTURE

(71) Applicant: QROMIS, Inc., Santa Clara, CA (US)

(72) Inventors: Vladimir Odnoblyudov, Danville, CA (US); Cem Basceri, Los Gatos, CA (US); Shari Farrens, Boise, ID (US)

(73) Assignee: Qromis, Inc., Santa Clara, CA (US)

( * ) Notice: Subject to any disclaimer, the term of this patent is extended or adjusted under 35 U.S.C. 154(b) by 103 days.

This patent is subject to a terminal disclaimer.

(21) Appl. No.: 15/621,338

(22) Filed: Jun. 13, 2017

(65) Prior Publication Data

US 2018/0047618 A1 Feb. 15, 2018

Related U.S. Application Data

(60) Provisional application No. 62/350,077, filed on Jun. 14, 2016.

(51) Int. Cl.
| | | |
|---|---|---|
| B32B 9/00 | (2006.01) |
| H01L 21/762 | (2006.01) |
| H01L 29/06 | (2006.01) |
| H01L 21/48 | (2006.01) |
| H01L 21/02 | (2006.01) |
| H01L 21/311 | (2006.01) |

(52) U.S. Cl.
CPC ........ H01L 21/76254 (2013.01); B32B 9/005 (2013.01); H01L 21/481 (2013.01); H01L 21/4871 (2013.01); H01L 29/0649 (2013.01); B32B 2307/704 (2013.01); B32B 2309/105 (2013.01); H01L 21/02164 (2013.01); H01L 21/02238 (2013.01); H01L 21/02255 (2013.01); H01L 21/31111 (2013.01)

(58) Field of Classification Search
None
See application file for complete search history.

(56) References Cited

U.S. PATENT DOCUMENTS

| | | | |
|---|---|---|---|
| 4,430,149 | A | 2/1984 | Berkman |
| 5,986,310 | A | 11/1999 | Peng |
| 6,328,796 | B1 | 12/2001 | Kub et al. |
| 8,709,901 | B1 | 4/2014 | Chang et al. |
| 9,997,353 | B1 | 6/2018 | Kumar et al. |
| 2005/0092235 | A1 | 5/2005 | Brabant et al. |

(Continued)

OTHER PUBLICATIONS

International Search Report and Written Opinion of the International Searching Authority of corresponding International Application No. PCT/US2017/037252 dated Aug. 28, 2017 (18 pages) in related U.S. Appl. No. 15/621,335.

(Continued)

*Primary Examiner* — Kenneth J Stachel

(74) *Attorney, Agent, or Firm* — Kilpatrick Townsend & Stockton LLP

(57) ABSTRACT

A substrate includes a polycrystalline ceramic core; a first adhesion layer encapsulating the polycrystalline ceramic core; a conductive layer encapsulating the first adhesion layer; a second adhesion layer encapsulating the conductive layer; a barrier layer encapsulating the second adhesion layer, and a bonding layer coupled to the barrier layer, and a substantially single crystalline silicon layer coupled to the bonding layer.

12 Claims, 5 Drawing Sheets

(56) References Cited

U.S. PATENT DOCUMENTS

| | | | |
|---|---|---|---|
| 2007/0141770 A1* | 6/2007 | Reber | H01L 21/02164 |
| | | | 438/197 |
| 2010/0006857 A1 | 1/2010 | Letertre | |
| 2011/0117726 A1* | 5/2011 | Pinnington | H01L 21/02389 |
| | | | 438/458 |
| 2014/0021483 A1* | 1/2014 | Chu | H01L 21/02458 |
| | | | 257/76 |
| 2014/0183442 A1 | 7/2014 | Odnoblyudov et al. | |
| 2014/0264719 A1 | 9/2014 | Chou et al. | |
| 2015/0090956 A1 | 4/2015 | Coones et al. | |
| 2018/0019120 A1 | 1/2018 | Semond et al. | |

OTHER PUBLICATIONS

Pre-Interview Office Action dated Oct. 17, 2018 in related U.S. Appl. No. 15/621,335 (four pages).

* cited by examiner

ENGINEERED SUBSTRATE STRUCTURE

CROSS-REFERENCES TO RELATED APPLICATIONS

This application claims priority to U.S. Provisional Patent Application No. 62/350,077, filed on Jun. 14, 2016, entitled "ENGINEERED SUBSTRATE STRUCTURE AND METHOD OF MANUFACTURE," the disclosure of which is hereby incorporated by reference in its entirety for all purposes.

The following two U.S. Patent Applications (including this one) are being filed concurrently, and the entire disclosure of the other application is incorporated by reference into this application for all purposes:

application Ser. No. 15/621,335, filed Jun. 13, 2017, entitled "ENGINEERED SUBSTRATE STRUCTURE FOR POWER AND RF APPLICATIONS", and application Ser. No. 15/621,338, filed Jun. 13, 2017, entitled "ENGINEERED SUBSTRATE STRUCTURE AND METHOD OF MANUFACTURE".

BACKGROUND OF THE INVENTION

Light-emitting diode (LED) structures are typically epitaxially grown on sapphire substrates. Many products currently use LED devices, including lighting, computer monitors, and other display devices.

The growth of gallium nitride based LED structures on a sapphire substrate is a heteroepitaxial growth process since the substrate and the epitaxial layers are composed of different materials. Due to the heteroepitaxial growth process, the epitaxially grown material can exhibit a variety of adverse effects, including reduced uniformity and reductions in metrics associated with the electronic/optical properties of the epitaxial layers. Accordingly, there is a need in the art for improved methods and systems related to epitaxial growth processes and substrate structures.

SUMMARY OF THE INVENTION

The present invention relates generally to engineered substrate structures. More specifically, the present invention relates to methods and systems suitable for use in epitaxial growth processes. Merely by way of example, the invention has been applied to a method and system for providing a substrate structure suitable for epitaxial growth that is characterized by a coefficient of thermal expansion (CTE) that is substantially matched to epitaxial layers grown thereon. The methods and techniques can be applied to a variety of semiconductor processing operations.

According to an embodiment of the present invention, a substrate is provided. The substrate includes a polycrystalline ceramic core; a first adhesion layer, such as a tetraethyl orthosilicate (TEOS) layer, encapsulating the polycrystalline ceramic core; a conductive layer, such as a polysilicon layer, encapsulating the first adhesion layer; a second adhesion layer, such as a second TEOS layer, encapsulating the conductive layer; and a barrier layer, such as a silicon nitride layer, encapsulating the second adhesion layer. The substrate also includes a bonding layer, such as a silicon oxide layer, coupled to the barrier layer, and a substantially single crystal silicon layer coupled to the bonding layer.

According to another embodiment of the present invention, a method of manufacturing a substrate is provided. The method includes providing a polycrystalline ceramic core; encapsulating the polycrystalline ceramic core in a first adhesion shell, such as a first tetraethyl orthosilicate (TEOS) shell; encapsulating the first adhesion shell in a conductive shell, such as a polysilicon shell; encapsulating the conductive shell in a second adhesion shell, such as a second TEOS shell; and encapsulating the second adhesion shell in a barrier shell, such as a silicon nitride shell. The method also includes joining a bonding layer, such as a silicon oxide layer, to the barrier shell, and joining a substantially single crystal silicon layer to the bonding layer.

Numerous benefits are achieved by way of the present invention over conventional techniques. For example, embodiments of the present invention provide an engineered substrate structure that is CTE matched to gallium nitride based epitaxial layers suitable for use in optical, electronic, and optoelectronic applications. Encapsulating layers utilized as components of the engineered substrate structure block diffusion of impurities present in central portions of the substrate from reaching the semiconductor processing environment in which the engineered substrate is utilized. These and other embodiments of the invention along with many of its advantages and features are described in more detail in conjunction with the text below and attached figures.

DETAILED DESCRIPTION OF SPECIFIC EMBODIMENTS

Embodiments of the present invention relate to engineered substrate structures. More specifically, the present invention relates to methods and systems suitable for use in epitaxial growth processes. Merely by way of example, the invention has been applied to a method and system for providing a substrate structure suitable for epitaxial growth that is characterized by a coefficient of thermal expansion (CTE) that is substantially matched to epitaxial layers grown thereon. The methods and techniques can be applied to a variety of semiconductor processing operations.

Figure 1:
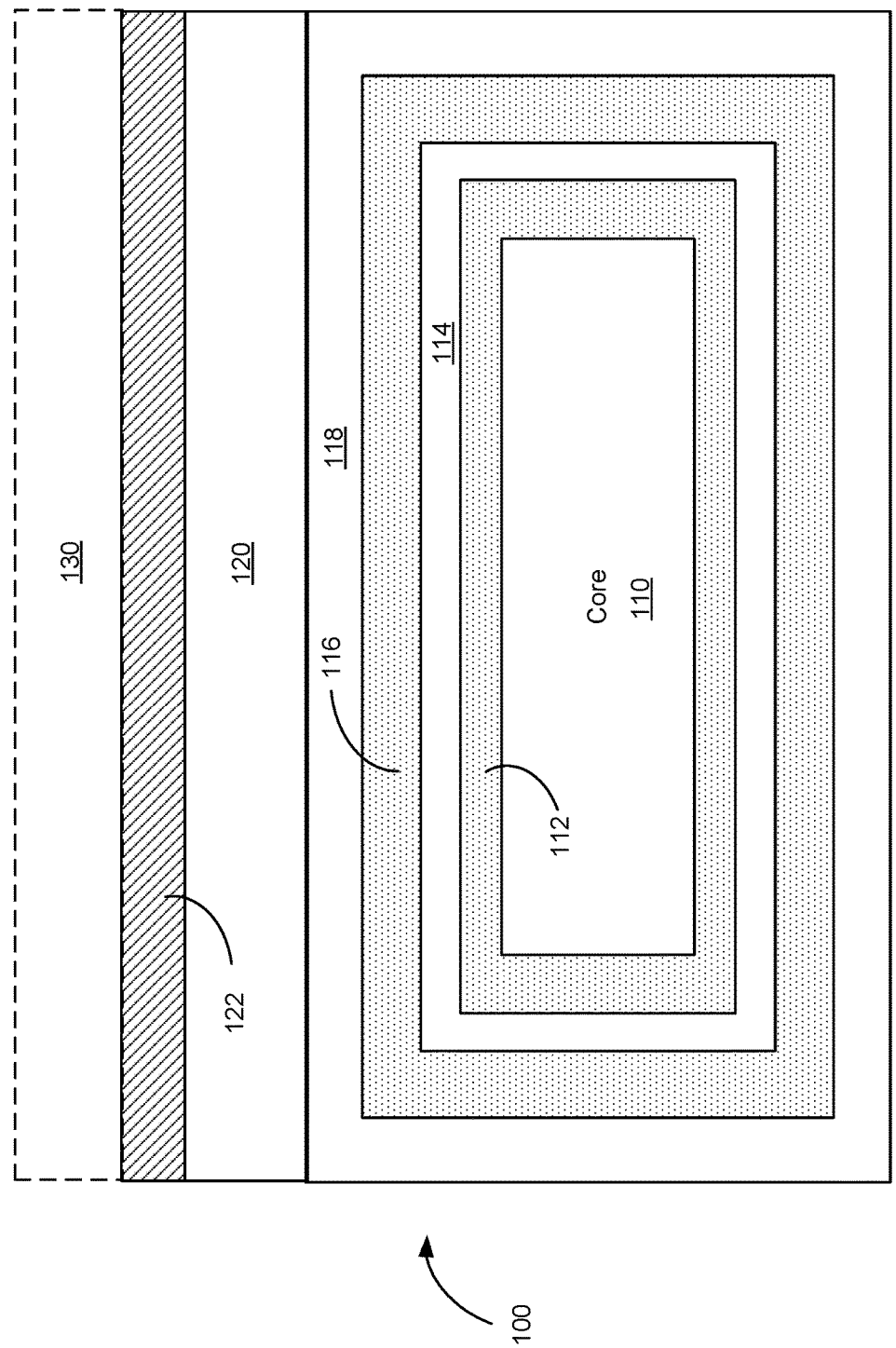
FIG. 1 is a simplified schematic diagram illustrating an engineered substrate structure according to an embodiment of the present invention.

FIG. 1 is a simplified schematic diagram illustrating an engineered substrate according to an embodiment of the present invention. The engineered substrate 100 illustrated in FIG. 1 is suitable for a variety of electronic and optical applications. The engineered substrate includes a core 110 that can have a coefficient of thermal expansion (CTE) that is substantially matched to the CTE of the epitaxial material that will be grown on the engineered substrate 100. Epitaxial material 130 is illustrated as optional because it is not required as an element of the engineered substrate, but will typically be grown on the engineered substrate.

For applications including the growth of gallium nitride (GaN)-based materials (epitaxial layers including GaN-based layers), the core 110 can be a polycrystalline ceramic material, for example, polycrystalline aluminum nitride (AlN) with binding agents, such as yttrium oxide. The thickness of the core can be on the order of 100 to 1,500 µm, for example, 725 µm. The core 110 is encapsulated in a first adhesion layer 112, such as a layer of tetraethyl orthosilicate (TEOS), on the order of 1,000 Å in thickness. The first adhesion layer 112 completely surrounds the core 110 in some embodiments to form a fully encapsulated core and can be formed using an LPCVD process.

A conductive layer 114, such as a layer of polysilicon, is formed surrounding the first adhesion layer 112. The thickness of the conductive layer 114 can be on the order of 500-5,000 Å, for example, 2,500 Å. The conductive layer 114 completely surrounds the first adhesion layer 112 in some embodiments to form a fully encapsulated first adhesion layer and can be formed using an LPCVD process. The polysilicon layer 114 can be doped to provide a highly conductive layer, for example, doped with boron to provide a p-type polysilicon layer. In some embodiments, the doping with boron is at a level ranging from about $1 \times 10^{19}$ cm$^{-3}$ to about $1 \times 10^{20}$ cm$^{-3}$ to provide for high conductivity. The conductive layer 114 can be useful during electrostatic chucking of the engineered substrate. One of ordinary skill in the art would recognize many variations, modifications, and alternatives.

A second adhesion layer 116, such as a layer of TEOS, is formed surrounding the conductive layer 114. The second adhesion layer 116 can be on the order of 1,000 Å in thickness. The second adhesion layer 112 completely surrounds the conductive layer 114 in some embodiments to form a fully encapsulated structure and can be formed using an LPCVD process.

A barrier layer 118, such as a layer of silicon nitride, is formed surrounding the second adhesion layer 116. The barrier layer 118 can be on the order of 1,000 Å to 10,000 Å in thickness. The barrier layer 118 completely surrounds the second adhesion layer 112 in some embodiments to form a fully encapsulated structure and can be formed using an LPCVD process.

In some embodiments, the barrier layer prevents diffusion and/or outgassing of elements present in the core 110, for example, yttrium oxide (i.e., yttria), oxygen, metallic impurities, other trace elements, and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments can be utilized in semiconductor process flows and clean room environments.

Figure 2A:
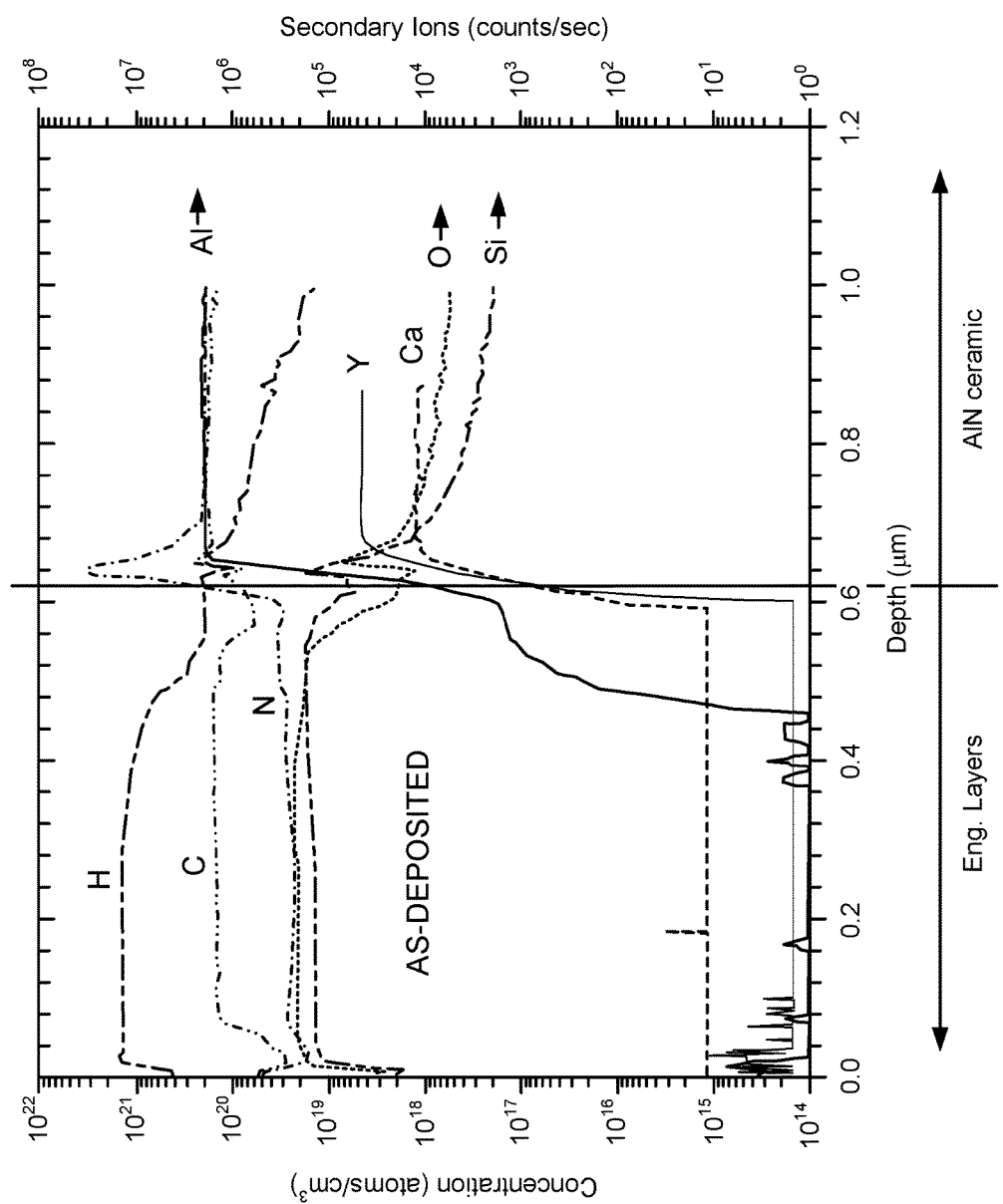
FIG. 2A is a SIMS profile illustrating species concentration as a function of depth for an engineered structure according to an embodiment of the present invention.

FIG. 2A is a SIMS profile illustrating species concentration as a function of depth for an engineered structure according to an embodiment of the present invention. The engineered structure did not include silicon nitride layer 118. Referring to FIG. 2A, several species present in the ceramic core (e.g., yttrium, calcium, and aluminum) drop to negligible concentrations in the engineered layers 120/122 (denoted as "Eng. Layers" in FIG. 2A). The concentrations of calcium, yttrium, and aluminum drop by three, four, and six orders of magnitude, respectively.

Figure 2B:
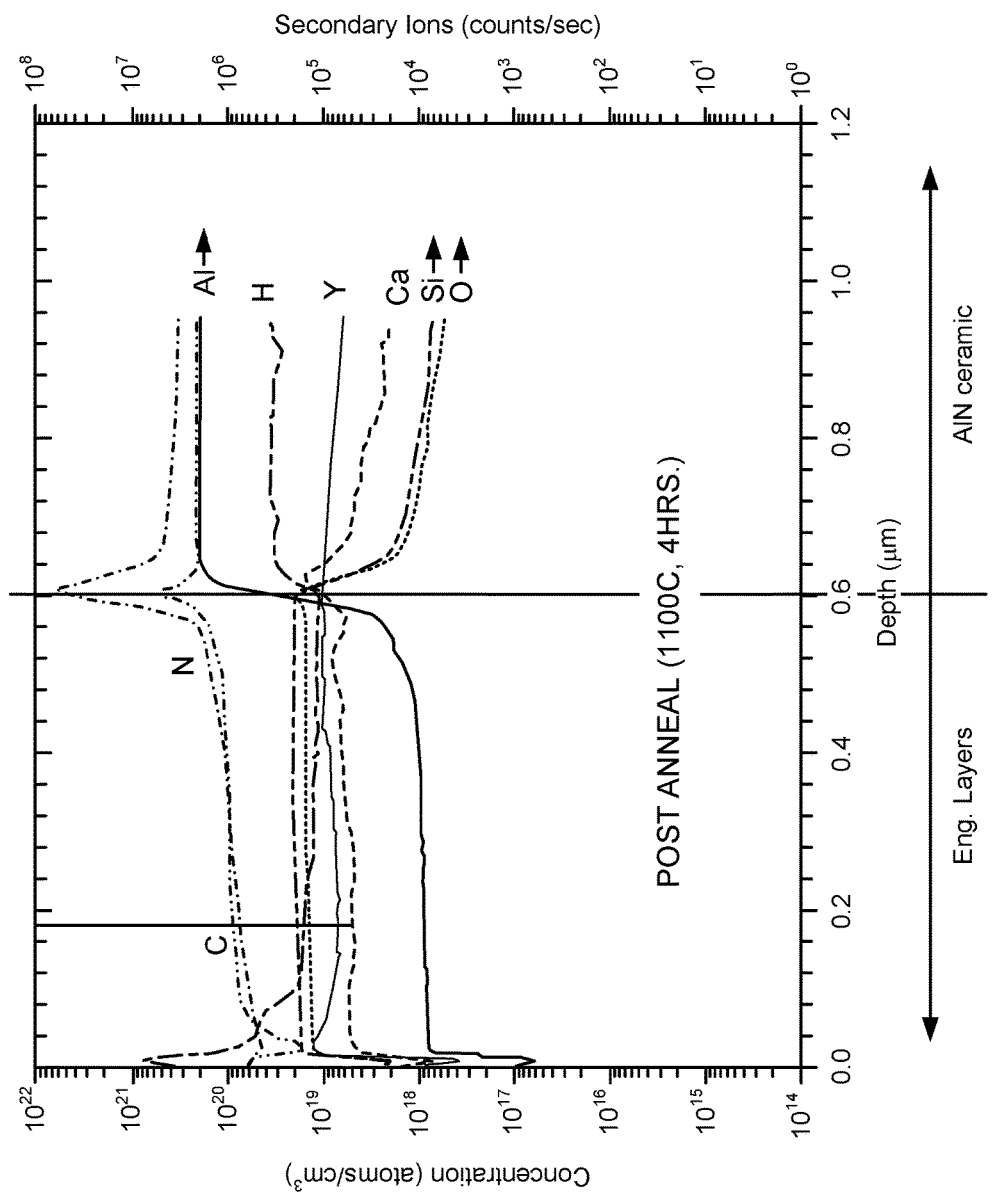
FIG. 2B is a SIMS profile illustrating species concentration as a function of depth for an engineered structure after anneal according to an embodiment of the present invention.

FIG. 2B is a SIMS profile illustrating species concentration as a function of depth for an engineered structure without a silicon nitride layer after anneal according to an embodiment of the present invention. As discussed above, during semiconductor processing operations, the engineered substrate structures provided by embodiments of the present invention can be exposed to high temperatures (~1,100° C.) for several hours, for example, during epitaxial growth of GaN-based layers.

For the profile illustrated in FIG. 2B, the engineered substrate structure was annealed at 1,100° C. for a period of four hours. As shown by FIG. 2B, calcium, yttrium, and aluminum, originally present in low concentrations in the as deposited sample, have diffused into the engineered layers (denoted as "Eng. Layers" in FIG. 2B), reaching concentrations similar to other elements.

Figure 2C:
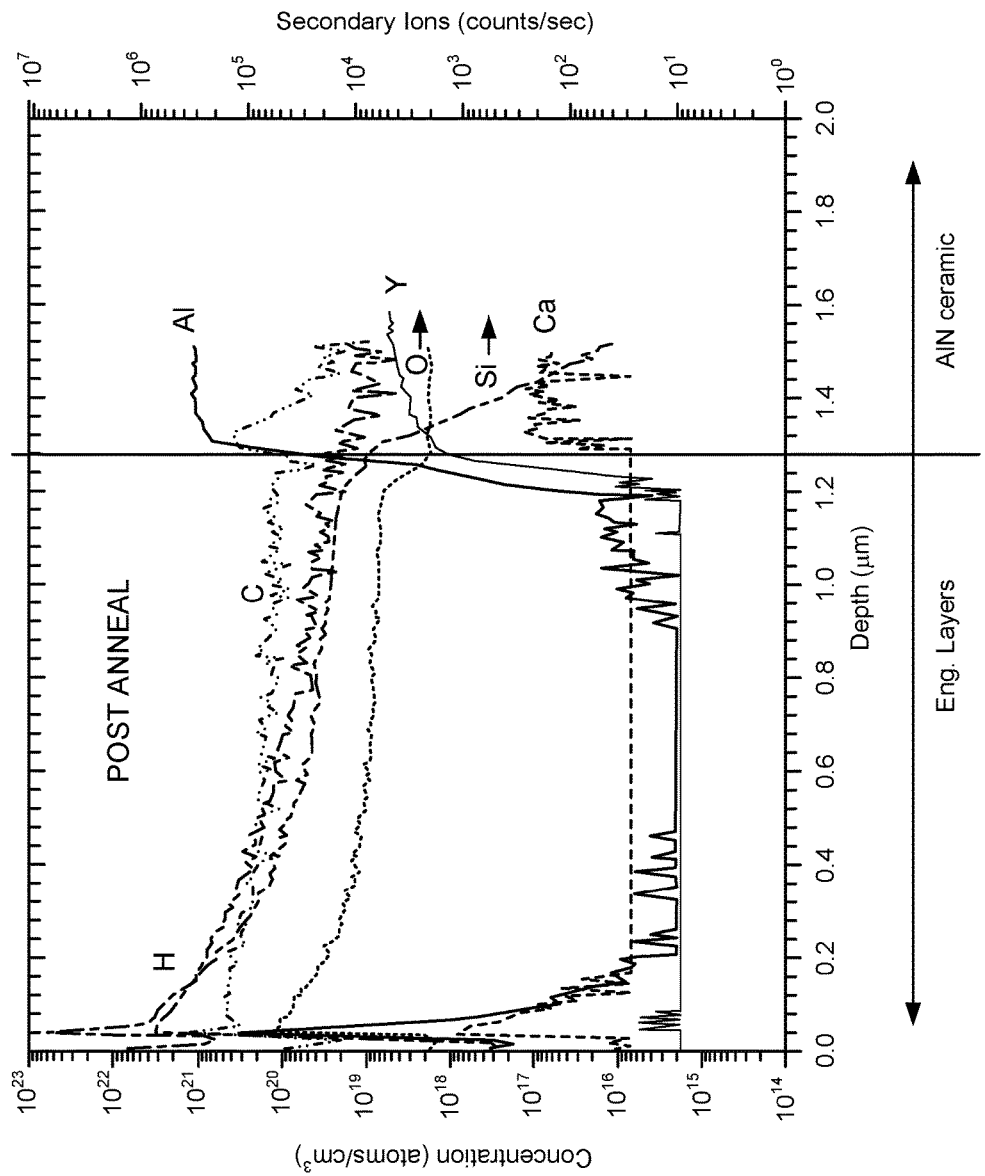
FIG. 2C is a SIMS profile illustrating species concentration as a function of depth for an engineered structure with a silicon nitride layer after anneal according to an embodiment of the present invention.

FIG. 2C is a SIMS profile illustrating species concentration as a function of depth for an engineered structure with a silicon nitride layer after anneal according to an embodiment of the present invention. The integration of the silicon nitride layer 118 into the engineered substrate structure prevents the diffusion of calcium, yttrium, and aluminum into the engineered layers (denoted as "Eng. Layers" in FIG. 2C) during the annealing process that occurred when the silicon nitride layer was not present. As illustrated in FIG. 2C, calcium, yttrium, and aluminum present in the ceramic core remain at low concentrations in the engineered layers post-anneal. Thus, the use of the silicon nitride layer 118 prevents these elements from diffusing through the diffusion barrier and thereby prevents their release into the environment surrounding the engineered substrate. Similarly, any other impurities contained within the bulk ceramic material would be contained by the barrier layer.

Typically, ceramic materials utilized to form the core 110 are fired at temperatures in the range of 1,800° C. It would be expected that this process would drive out a significant amount of impurities present in the ceramic materials. These impurities can include yttrium, which results from the use of yttria as sintering agent, calcium, and other elements and compounds. Subsequently, during epitaxial growth processes, which are conducted at much lower temperatures in the range of 800° C. to 1,100° C., it would be expected that the subsequent diffusion of these impurities would be insignificant. However, contrary to conventional expectations, the inventors have determined that even during epitaxial growth processes at temperatures much less than the firing temperature of the ceramic materials, significant diffusion of elements through the layers of the engineered substrate can occur. Thus, embodiments of the present invention integrate a silicon nitride layer 118 to prevent out-diffusion of the background elements from the polycrystalline ceramic material (e.g., AlN) into the engineered layers 120/122 and epitaxial layers such as optional GaN layer 130. The silicon nitride layer 118 encapsulating the underlying layers and material provides the desired barrier layer functionality.

Referring once again to FIG. 1, a bonding layer 120 (e.g., a silicon oxide layer) is deposited on a portion of the barrier layer 118 (e.g., a silicon nitride layer), for example, the top surface of the barrier layer 118, and subsequently used during the bonding of a substantially single crystal silicon layer 122. The bonding layer 120 can be approximately 1.5 µm in thickness in some embodiments.

The substantially single crystalline silicon layer 122 is suitable for use as a growth layer during an epitaxial growth process for the formation of epitaxial material 130. In some embodiments, the epitaxial material 130 includes a GaN layer 2 µm to 10 µm in thickness, which can be utilized as one of a plurality of layers utilized in optoelectronic devices, RF devices, power devices, and the like. In an embodiment, the substantially single crystalline silicon layer 122 includes a single crystal silicon layer that is attached to the bonding layer 118 using a layer transfer process.

Figure 3:
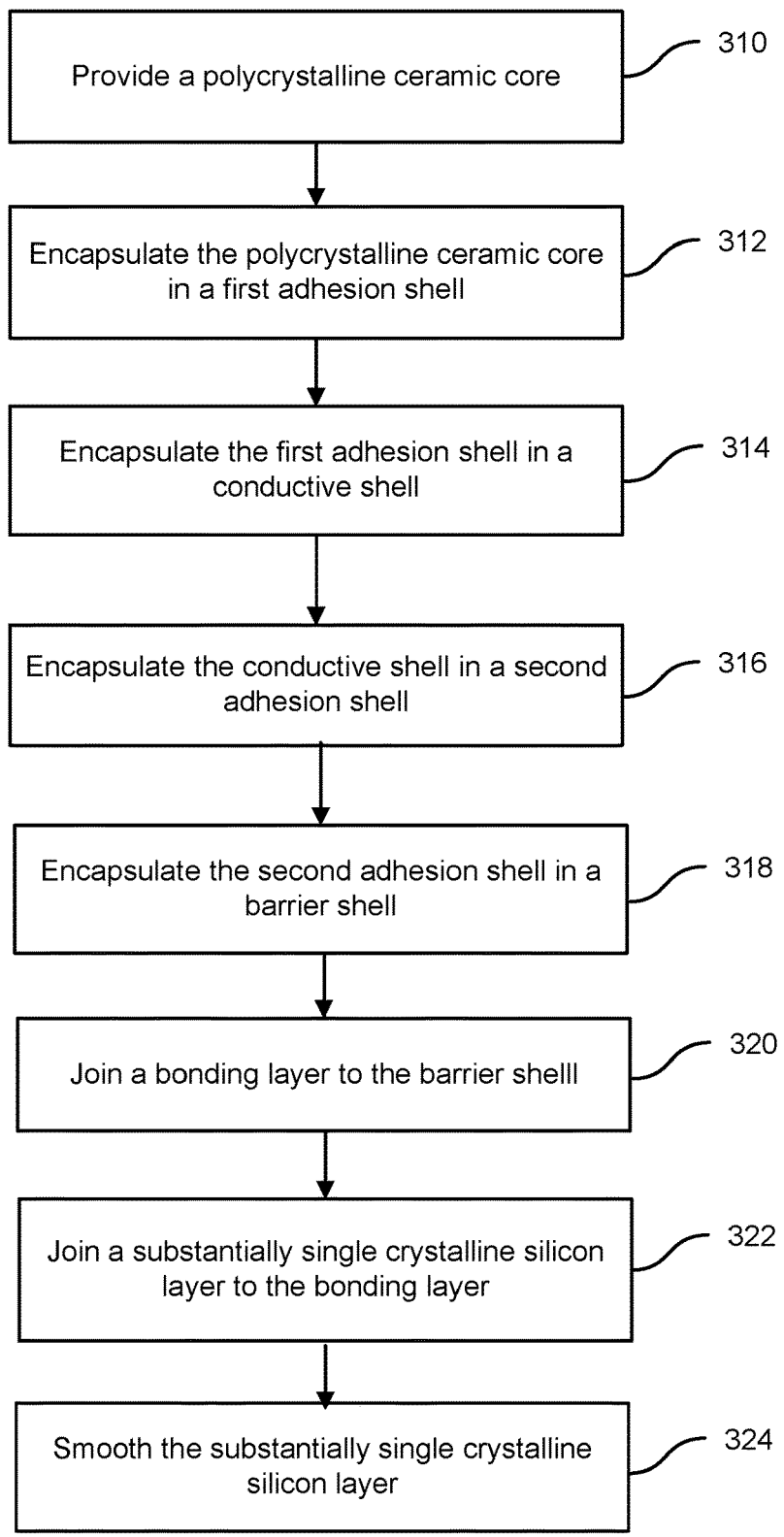
FIG. 3 is a simplified flowchart illustrating a method of fabricating an engineered substrate according to an embodiment of the present invention.

FIG. 3 is a simplified flowchart illustrating a method of fabricating an engineered substrate according to an embodiment of the present invention. The method can be utilized to manufacture a substrate that is CTE matched to one or more of the epitaxial layers grown on the substrate. The method 300 includes providing a polycrystalline ceramic core (310), encapsulating the polycrystalline ceramic core in a first adhesion shell (312), and encapsulating the first adhesion shell in a conductive shell (314). In some embodiments, the polycrystalline ceramic core can include polycrystalline aluminum nitride. The first adhesion shell can include a single layer of tetraethyl orthosilicate (TEOS). The conductive shell can include a single layer of polysilicon.

The method also includes encapsulating the conductive shell in a second adhesion shell (316) and encapsulating the second conductive shell in a barrier shell (318). In some embodiments, the second adhesion shell can include a single layer of TEOS. The barrier shell can include a single layer of silicon nitride.

The method further includes joining a bonding layer to the barrier shell (320), and joining a substantially single crystalline silicon layer to the bonding layer (322). In some embodiments, the bonding layer can include silicon oxide. In an embodiment as described below, joining the substantially single crystalline silicon layer to the bonding layer utilizes a layer transfer process in which the single crystal silicon layer is transferred from a bare silicon wafer.

Referring to FIG. 1, the bonding layer 120 can be formed by a deposition of a thick (e.g., 2-5 µm thick) oxide layer followed by a chemical mechanical polishing (CMP) process to thin the oxide to approximately 1.5 µm in thickness. The thick initial oxide serves to smooth surface features present on the support structure that may remain after fabrication of the polycrystalline core and continue to be present as the encapsulating layers illustrated in FIG. 1 are formed. The CMP process provides a substantially planar surface free of voids, which can then be used during a wafer transfer process to bond the substantially single crystalline silicon layer 122 to the silicon oxide layer 120.

A layer transfer process can be used to join the substantially single crystalline silicon layer 122 to the bonding layer 120. In some embodiments, a silicon wafer (e.g., a silicon (111) wafer) is implanted to form a cleave plane. After wafer bonding, the silicon substrate can be removed along with the portion of the single crystal silicon layer below the cleave plane, resulting in the exfoliated single crystal silicon layer 122 illustrated in FIG. 1. The thickness of the substantially single crystal layer 122 can be varied to meet the specifications of various applications. Moreover, the crystal orientation of the substantially single crystal layer 122 can be varied to meet the specifications of the application. Additionally, the doping levels and profile in the substantially single crystal layer 122 can be varied to meet the specifications of the particular application.

The method illustrated in FIG. 3 may also include smoothing the substantially single crystal layer (324). In some embodiments, the thickness and the surface roughness of the substantially single crystal layer 122 can be modified for high quality epitaxial growth. Different device applications may have slightly different specifications regarding the thickness and surface smoothness of the substantially single crystal layer 122. The cleave process delaminates the substantially single crystal layer 122 from a bulk single crystal silicon wafer at a peak of an implanted ion profile. After cleaving, the substantially single crystal layer 122 can be adjusted or modified in several aspects before it is utilized as a growth surface for epitaxial growth of other materials, such as gallium nitride.

First, the transferred substantially single crystal layer 122 may contain a small amount of residual hydrogen concentration and may have some crystal damage from the implant. Therefore, it may be beneficial to remove a thin portion of the transferred substantially single crystal layer 122 where the crystal lattice is damaged. In some embodiments, the depth of the implant may be adjusted to be greater than the desired final thickness of substantially single crystal layer 122. The additional thickness allows for the removal of the thin portion of the transferred substantially single crystal layer that is damaged, leaving behind the undamaged portion of the desired final thickness.

Second, it may be desirable to adjust the total thickness of the substantially single crystal layer 122. In general, it may be desirable to have the substantially single crystal layer 122 thick enough to provide a high quality lattice template for the subsequent growth of one or more epitaxial layers but thin enough to be highly compliant. The substantially single crystal layer 122 may be said to be "compliant" when the substantially single crystal layer 122 is relatively thin such that its physical properties are less constrained and able to mimic those of the materials surrounding it with less propensity to generate crystalline defects. The compliance of the substantially single crystal layer 122 may be inversely related to the thickness of the substantially single crystal layer 122. A higher compliance can result in lower defect densities in the epitaxial layers grown on the template and enable thicker epitaxial layer growth. In some embodiments, the thickness of the substantially single crystal layer 122 may be increased by epitaxial growth of silicon on the exfoliated silicon layer.

Third, it may be beneficial to improve the smoothness of the substantially single crystal layer 122. The smoothness of the layer may be related to the total hydrogen dose, the presence of any co-implanted species, and the annealing conditions used to form the hydrogen-based cleave plane. The initial roughness resulting from the layer transfer (i.e., the cleave step) may be mitigated by thermal oxidation and oxide strip, as discussed below.

In some embodiments, the removal of the damaged layer and adjusting the final thickness of the substantially single crystal layer 122 may be achieved through thermal oxidation of a top portion of the exfoliated silicon layer, followed by an oxide layer strip with hydrogen fluoride (HF) acid. For example, an exfoliated silicon layer having an initial thickness of 0.5 □m may be thermally oxidized to create a silicon dioxide layer that is about 420 nm thick. After removal of the grown thermal oxide, the remaining silicon thickness in the transferred layer may be about 53 nm. During thermal oxidation, implanted hydrogen may migrate toward the surface. Thus, the subsequent oxide layer strip may remove some damage. Also, thermal oxidation is typically performed at a temperature of 1000° C. or higher. The elevated temperature can may also repair lattice damage.

The silicon oxide layer formed on the top portion of the substantially single crystal layer during thermal oxidation can be stripped using HF acid etching. The etching selectivity between silicon oxide and silicon ($SiO_2$: Si) by HF acid may be adjusted by adjusting the temperature and concentration of the HF solution and the stoichiometry and density of the silicon oxide. Etch selectivity refers to the etch rate of one material relative to another. The selectivity of the HF solution can range from about 10:1 to about 100:1 for ($SiO_2$:Si). A high etch selectivity may reduce the surface roughness by a similar factor from the initial surface roughness. However, the surface roughness of the resultant substantially single crystal layer 122 may still be larger than desired. For example, a bulk Si (111) surface may have a root-mean-square (RMS) surface roughness of less than 0.1 nm as determined by a 2 µm×2 µm atomic force microscope (AFM) scan before additional processing. In some embodiments, the desired surface roughness for epitaxial growth of gallium nitride materials on Si (111) may be, for example, less than 1 nm, less than 0.5 nm, or less than 0.2 nm, on a 30 µm×30 µm AFM scan area.

If the surface roughness of the substantially single crystal layer 122 after thermal oxidation and oxide layer strip exceeds the desired surface roughness, additional surface smoothing may be performed. There are several methods of smoothing a silicon surface. These methods may include hydrogen annealing, laser trimming, plasma smoothing, and touch polish (e.g., chemical mechanical polishing or CMP). These methods may involve preferential attack of high aspect ratio surface peaks. Hence, high aspect ratio features on the surface may be removed more quickly than low aspect ratio features, thus resulting in a smoother surface.

It should be appreciated that the specific steps illustrated in FIG. 3 provide a particular method of fabricating an engineered substrate according to an embodiment of the present invention. Other sequences of steps may also be performed according to alternative embodiments. For example, alternative embodiments of the present invention may perform the steps outlined above in a different order. Moreover, the individual steps illustrated in FIG. 3 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A substrate comprising:
    a polycrystalline ceramic core;
    a first adhesion layer encapsulating the polycrystalline ceramic core;
    a conductive layer encapsulating the first adhesion layer;
    a second adhesion layer encapsulating the conductive layer;
    a barrier layer encapsulating the second adhesion layer;
    a bonding layer coupled to the barrier layer; and
    a substantially single crystalline silicon layer coupled to the bonding layer.

2. The substrate of claim 1 wherein the polycrystalline ceramic core comprises polycrystalline aluminum nitride.

3. The substrate of claim 1 wherein the first adhesion layer comprises tetraethyl orthosilicate (TEOS).

4. The substrate of claim 1 wherein the first adhesion layer has a thickness of about 1000 Å.

5. The substrate of claim 1 wherein the conductive layer comprises polysilicon.

6. The substrate of claim 1 wherein the conductive layer has a thickness of about 3000 Å.

7. The substrate of claim 1 wherein the second adhesion layer comprises tetraethyl orthosilicate (TEOS).

8. The substrate of claim 1 wherein the second adhesion layer has a thickness of about 1000 Å.

9. The substrate of claim 1 wherein the barrier layer comprises silicon nitride.

10. The substrate of claim 1 wherein the barrier layer has a thickness of about 4000 Å.

11. The substrate of claim 1 wherein the substantially single crystalline silicon layer comprises an exfoliated silicon layer.

12. The substrate of claim 1 wherein the substantially single crystalline silicon layer has a thickness of about 0.5 µm.

* * * * *